United States Patent
Kim et al.

(10) Patent No.: US 8,130,890 B2
(45) Date of Patent: Mar. 6, 2012

(54) SEMICONDUCTOR MEMORY DEVICE HAVING DATA CLOCK TRAINING CIRCUIT

(75) Inventors: Kyung-Hoon Kim, Kyoungki-do (KR);
Yong-Ki Kim, Kyoungki-do (KR);
Dae-Han Kwon, Kyoungki-do (KR);
Taek-Sang Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1103 days.

(21) Appl. No.: 12/005,492

(22) Filed: Dec. 27, 2007

(65) Prior Publication Data

US 2009/0116598 A1     May 7, 2009

(30) Foreign Application Priority Data

Nov. 2, 2007   (KR) .................. 10-2007-0111532

(51) Int. Cl.
*H04L 7/02* (2006.01)
*H04L 7/04* (2006.01)
(52) U.S. Cl. ....................... 375/360; 375/362
(58) Field of Classification Search .............. 327/113; 375/360
See application file for complete search history.

(56) References Cited

U.S. PATENT DOCUMENTS

| | | | |
|---|---|---|---|
| 6,614,865 B1 * | 9/2003 | Ishimi | 375/373 |
| 7,683,683 B1 * | 3/2010 | Majumder et al. | 327/122 |
| 2003/0193355 A1 * | 10/2003 | Leifso et al. | 327/115 |
| 2005/0058233 A1 * | 3/2005 | Nguyen et al. | 375/354 |
| 2005/0213699 A1 * | 9/2005 | Boerstler et al. | 377/47 |

FOREIGN PATENT DOCUMENTS

KR   1997-0049268   7/1997

OTHER PUBLICATIONS

Jedec, GDDR5 TG Report, Jun. 9 Committee Meeting—Montreal (Jun. 2, 2009) 35 pages.

* cited by examiner

*Primary Examiner* — Hoai V Ho
*Assistant Examiner* — Min Huang
(74) *Attorney, Agent, or Firm* — Blakely, Sokoloff, Taylor & Zafman

(57) ABSTRACT

A data clock frequency divider circuit includes a training decoder and a frequency divider. The training decoder outputs a clock alignment training signal, which is indicative of the start of a clock alignment training, in response to a command and an address of a mode register set. The frequency divider, which is reset in response to an output of the training decoder, receives an internal data clock to divide a frequency of the internal data clock in half. The data clock frequency divider circuit secures a sufficient operating margin so that a data clock and a system clock are aligned within a pre-set clock training operation time by resetting the data clock to correspond to a timing in which the clock training operation starts, thereby providing a clock training for a high-speed system.

9 Claims, 1 Drawing Sheet

SEMICONDUCTOR MEMORY DEVICE HAVING DATA CLOCK TRAINING CIRCUIT

CROSS-REFERENCES TO RELATED APPLICATION

The present application claims priority to Korean application number 10-2007-0111532, filed on Nov. 2, 2007, which is incorporated by reference in its entirety.

BACKGROUND OF THE INVENTION

The present invention relates to a semiconductor memory device and, more particularly, to a circuit and a method for performing a clock training in order to align a data transfer between an apparatus having a high speed data processing function and a semiconductor memory device.

In a system including a plurality of semiconductor devices, the semiconductor memory device stores data. When a data processing unit, i.e., a CPU, requires data, the semiconductor memory device outputs data corresponding to an address inputted from the data processing unit or stores data provided from the data processing unit in a cell position corresponding to the address.

With the increase in the operation speed of a system having semiconductor devices and the development of a technology regarding a semiconductor integrated circuit, the semiconductor memory device is required to output or store data faster than before. In order to input/output data in a high speed, a synchronous memory device, which is capable of inputting/outputting data in synchronization with a system clock inputted from the outside, has been developed. However, since the synchronous memory device does not sufficiently satisfy the required speed of inputting/outputting data, a DDR (Double Data Rate) synchronous memory device, which is capable of inputting/outputting data at a rising edge and a falling edge of a system clock, respectively, has been developed.

Since the DDR synchronous memory device should input/output data at the rising edge and the falling edge of the system clock, respectively, it should process two data within one time period of the system clock. That is, the DDR synchronous memory device should output data or receive and store data at the rising edge and the falling edge of the system clock, respectively. Particularly, a timing at which the DDR synchronous memory device outputs data should accurately synchronize with the rising edge or the falling edge of the system clock. Thus, a data output circuit within the DDR synchronous memory device is used to control an internal output and a transfer timing of data so that the data are in synchronization with the rising edge and the falling edge of the inputted system clock to be outputted.

Recently, in the semiconductor memory device capable of processing large-capacity data faster, the input/output speed of an address as well as data is increased. In the conventional semiconductor memory device, the address is in synchronization with a rising edge of a clock along with an external operation command to be inputted. That is, the conventional semiconductor memory device receives the address and the operation command inputted from the outside once per period of the external clock (namely, in response to the rising edge) to perform an internal operation. However, with the increase in the operation speed of the semiconductor memory device, a structure in which the semiconductor memory device receives the address not once but twice is suggested.

A GDDR5 (Graphics Double Data Rate version 5) semiconductor memory device for a graphics operation is designed to receive the address at the falling edge as well as the rising edge of the external clock. Since the GDDR5 semiconductor memory device can receive the address twice within one period, the number of address pins is reduced as compared with the conventional semiconductor memory device and remaining address pins are connected to a power supply voltage or a ground voltage so that the operation speed of the semiconductor memory device can be increased. Since the operation command inputted from the outside is still inputted in response to the rising edge of the external clock, the input speed of an address signal becomes twice as fast as the input speed of the operation command, and the large-capacity semiconductor memory device can be supported in a high speed.

Also, the GDDR5 semiconductor memory device inputs/outputs two data between the rising edge and the falling edge of the external clock and inputs/outputs two data between the falling edge and the next rising edge of the external clock. That is, the GDDR5 semiconductor memory device inputs/outputs four data within one period of the external clock.

The high-speed semiconductor memory device uses, as a reference clock, the system clock which is used for transferring and receiving the address and the command and a data clock which is used for inputting/outputting data. Here, the frequency of the data clock is twice as much as that of the system clock. That is, unlike the conventional semiconductor memory device which performs internal operations, such as a read or write operation, using one system clock as a reference, the high-speed semiconductor memory device and the data processing unit use two clocks having different frequencies to exchange data. However, if the phases of the system clock and the data clock are not aligned, the reference signal for transferring the command and the address and the reference signal for transferring data are not aligned, that is, the semiconductor memory device cannot normally operate. Therefore, an interface training between the semiconductor memory device and the data processing unit is initially performed.

The interface training is performed to train an interface for transferring the command, the address and the data to operate at an optimized timing before a normal operation between the semiconductor memory device and the data processing unit is performed. The interface training includes an address training, a clock alignment training (or WCK2CK training), a read training and a write training. Particularly, in a system in which the clock used for the reference signal for transferring the command and the address and the clock used for the reference signal for transferring data exist separately, the clock alignment training is for aligning the data clock (WCK) with the system clock (CK) before the high-speed semiconductor memory device performs the read and write operations.

SUMMARY OF THE INVENTION

The present invention is directed to securing a sufficient operating margin so that a data clock and a system clock are aligned within a pre-set clock training operation time by resetting the data clock to correspond to a timing in which the clock training operation starts, thereby providing a clock training for a high-speed system.

The phases of the system clock for transferring a command and the data clock for transferring data should be controlled to align the system clock with the data clock so that various kinds of interface trainings are performed within a predetermined time during the initial operation of a semiconductor memory device and a data processing unit and thus a stable operation is performed. The present invention is directed to providing a device for resetting the fixed data clock in response to a control signal which is indicative of the start of the clock alignment training operation to secure the sufficient operating margin of the clock alignment training during the interface training required in the high-speed semiconductor device and the data processing unit.

The semiconductor memory device of the present invention maintains a stable operation in a high speed and increases reliability by aligning the system clock with the data clock and sufficiently securing the operating margin for the clock alignment training to synchronize an output of the data corresponding to an external command.

Also, the semiconductor memory device of the present invention provides a method of resetting a data clock frequency divider and initializes it to make the phases of the system clock and the data clock having a half-divided frequency the same so that the operating margin for aligning the system clock with the data clock is secured and an error due to the phase difference between the system clock and the data clock having the half-divided frequency is removed.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, the present invention will be described in detail through embodiments. The embodiments are just for exemplifying the present invention, and the scope of right to be protected of the present invention is not limited by them.

Figure 1:
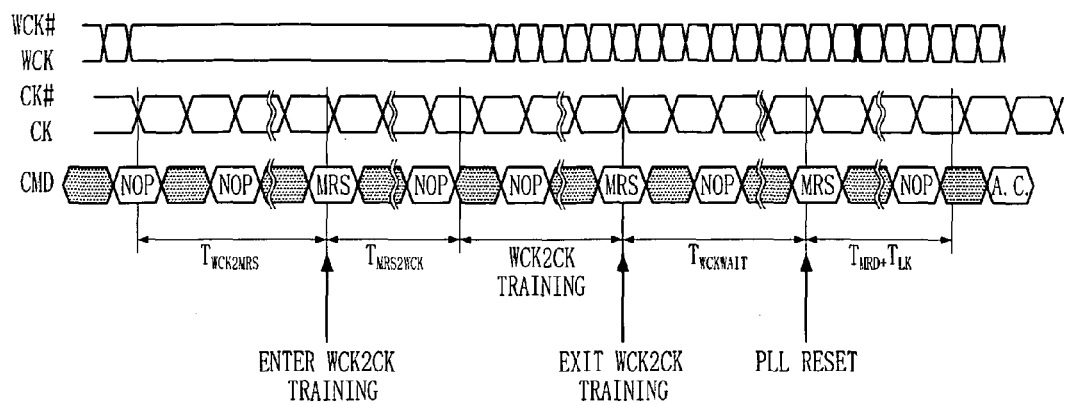
FIG. 1 is a timing view illustrating a clock alignment training operation of a semiconductor memory device according to one embodiment of the present invention.

FIG. 1 is a timing view illustrating a clock alignment training operation of a semiconductor memory device according to one embodiment of the present invention.

As shown in FIG. 1, a time required to perform the clock alignment training operation of the semiconductor memory device, until a phase locked loop (PLL) is reset, is divided into four sections.

First, a preparation time $T_{WCK2MRS}$ is a time taken from an inactivation and fixation of data clocks WCK and WCK# to a start of the clock alignment training through a mode register set (MRS). Referring to FIG. 1, in order to start the clock alignment training, the data clocks WCK and WCK# are inactivated to a low level to be fixed. The inactivation of the data clocks WCK and WCK# is a condition to start the clock alignment training. Thereafter, there is provided a clock activation time $T_{MRS2WCK}$ taken from the start of the clock alignment training to an activation of the data clocks WCK and WCK# to be toggled. When the data clocks WCK and WCK# are activated, the clock alignment training WCK2CK TRAINING, in which the phases of the data clocks WCK and WCK# and system clocks CK and CK# are aligned, is performed within a predetermined time. The clock alignment training WCK2CK TRAINING is terminated through the mode register set or another command. Then, there exists a waiting time $T_{WCKWAIT}$ until the phase locked loop is reset.

Here, it is desirable to inactivate the phase locked loop during the clock alignment training operation to align the data clocks WCK and WCK# with the system clocks CK and CK# because the phases of the data clocks WCK and WCK# can be continuously changed due to the operation of the phase locked loop. However, it is important not to use an output of the phase locked loop regardless of the state of the phase locked loop. Also, in order to perform the clock alignment training operation, the system clocks CK and CK# should be stably toggled and an address timing, which relates to an address that is transferred corresponding to the system clocks CK and CK# through an address training, should be guaranteed.

The clock alignment training, which is performed between the semiconductor memory device and the data processing unit, will be described in detail. First, the data processing unit inactivates the data clocks WCK and WCK# to be fixed before the clock alignment training starts and transfers the command to start the clock alignment training and the data clocks WCK and WCK#. The semiconductor memory device outputs an internal command of the mode register set corresponding to the command and decodes the internal command and an address of the mode register set to output a clock alignment training signal which is indicative of the start of the clock alignment training. Since the frequency of the data clocks WCK and WCK# is different from that of the system clocks CK and CK#, in order to align the phase of the data clocks WCK and WCK# with the phase of the system clocks CK and CK#, either the frequency of the data clocks WCK and WCK# or the frequency of the system clocks CK and CK# should be divided to make the different frequency identical. Thus, the semiconductor memory device divides the frequency of the data clocks WCK and WCK# in half and aligns the phase of the data clocks WCK and WCK# having the half-divided frequency with the phase of the system clocks CK and CK#.

Figure 2:
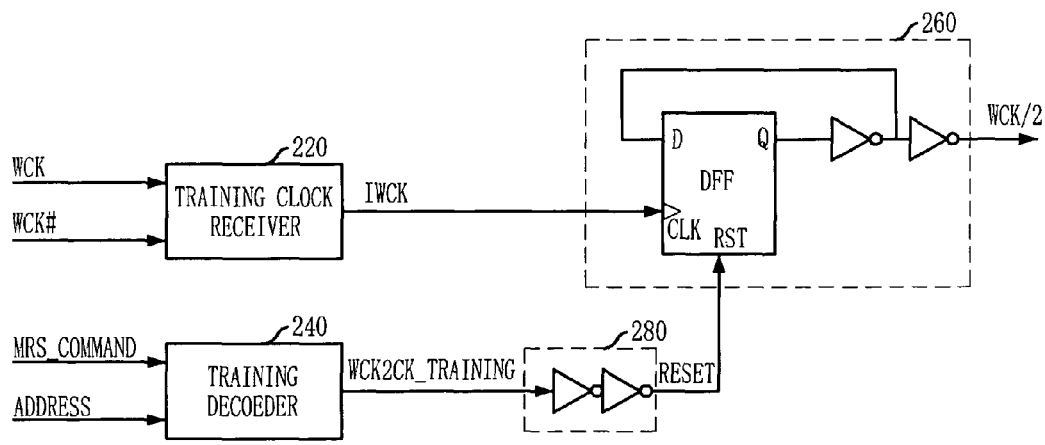
FIG. 2 is a block diagram illustrating a data clock frequency divider of the semiconductor memory device according to one embodiment of the present invention.

FIG. 2 is a block diagram illustrating a clock frequency divider of the semiconductor memory device according to one embodiment of the present invention.

As shown in FIG. 2, the clock frequency divider includes a training decoder 240 for outputting the clock alignment training signal WCK2CK_TRAINING which is indicative of the start of the clock alignment training in response to the internal command MRS_COMMAND and the address ADDRESS of the mode register set and a frequency divider 260, which is reset in response to an output of the training decoder 240, for receiving an internal data clock IWCK to divide the frequency of the internal data clock IWCK in half. Also, the clock frequency divider further includes a training clock receiver 220 for receiving the data clock WCK and its inverted clock WCK# to output the internal data clock IWCK of which the duty ratio is controlled.

The semiconductor memory device aligns the phases of the data clock WCK/2 of the half-divided frequency outputted from the frequency divider 260 with the system clock CK in response to the clock alignment training signal WCK2CK_TRAINING. Particularly, the frequency divider 260 is reset in synchronization with the clock alignment training signal WCK2CK_TRAINING which is indicative of the start of the clock training operation. Referring to FIG. 1, a certain time when a phase alignment occurs after the clock activation time $T_{MRS2WCK}$, in which the data clocks WCK and WCK# are activated, exists between the start and the termination of the clock alignment training WCK2CK TRAINING. In order to secure a sufficient operating margin for the phase alignment, the clock activation time $T_{MRS2WCK}$ should be minimized. Thus, in the semiconductor memory device according to one embodiment of the present invention, the frequency divider 260 outputs the data clock WCK/2, of which the frequency is half-divided, in response to the clock alignment training signal WCK2CK_TRAINING that is indicative of the start of the clock alignment training WCK2CK TRAINING in order to increase the operating margin for the phase alignment.

Also, as shown in FIG. 2, the clock frequency divider additionally includes a buffer unit 280, having an even number of inverters that are in series connected, for transferring a reset signal RESET, which is the buffered clock alignment training signal WCK2CK_TRAINING outputted from the training decoder 240, to the frequency divider 260. At this time, the shorter a delay time in the buffer unit 280 is, the more increased the operating margin for the semiconductor memory device to perform the clock alignment training is.

After the frequency divider 260 is reset by the reset signal RESET outputted from the buffer unit 280, the frequency divider 260 outputs the data clock WCK/2 of which the frequency is half-divided. In detail, the frequency divider 260 includes a flip-flop of which a clock terminal receives the internal data clock IWCK and of which a reset terminal receives the output of the training decoder 240, a first inverter for inverting an output of the flip-flop to feed back the output to an input terminal and a second inverter for inverting an output of the first inverter.

The entire system according to the present invention includes the data processing unit which inactivates and fixes the data clock and transfers a command for the performance of the clock alignment training and the data clock and the semiconductor memory device which generates the clock alignment training signal in response to the command and divides the frequency of the data clock in half in response to the clock alignment training signal to align the phases of the data clock of which the frequency is half-divided with the system clock. Particularly, the present invention not only divides the frequency of the data clock in half but also performs a frequency dividing operation in response to the clock alignment training signal so that the operating margin for the performance of the clock alignment training to align the phases of the two reference clocks (the system clock which is a reference signal for transferring a command and an address and the data clock which is a reference signal for transferring data) is sufficiently secured in the system using the two reference clocks having different frequencies.

While the present invention has been described with respect to the particular embodiments, it will be apparent to those skilled in the art that various changes and modifications may be made without departing from the spirit and scope of the invention as defined in the following claims.

What is claimed is:

1. A system comprising:
 a data processing unit configured to inactivate and fix a data clock and transferring a command for the performance of a clock alignment training and the data clock; and
 a semiconductor memory device configured to generate a clock alignment training signal in response to the command and dividing a frequency of the data clock in half in response to the clock alignment training signal to align phases of the data clock of which the frequency is half-divided and a system clock and, wherein the semiconductor memory device comprises:
 a training decoder configured to generate the clock alignment training signal by decoding a command and an address of a mode register set corresponding to the command; and
 a frequency divider, which is reset in response to an output of the training decoder, configured to receive an internal data clock to divide a frequency of the internal data clock in half,
 a data transfer between the semiconductor memory device and the data processing unit is aligned after operations of the training decoder and the frequency divider are preformed.

2. The system of claim 1, further comprising a training clock receiver configured to receive the data clock and an inverted clock of the data clock to output the internal data clock of which a duty ratio is controlled.

3. The system of claim 1, further comprising a buffer unit having an even number of inverters, which are in series connected, for buffering the output of the training decoder to transfer the output to the frequency divider.

4. The system of claim 1, wherein the frequency divider includes:
 a flip-flop of which a clock terminal receives the internal data clock and of which a reset terminal receives the output of the training decoder;
 a first inverter configured to invert an output of the flip-flop to feed back the output to an input terminal; and
 a second inverter configured to invert an output of the first inverter.

5. The system of claim 1, wherein the internal data clock is inactivated to be fixed until the clock alignment training starts.

6. A system operation method comprising the steps of:
 inactivating and fixing a data clock before a clock alignment training between a semiconductor memory device and a data processing unit starts;
 transferring a command for the performance of the clock alignment training and the data clock;
 outputting an internal command of a mode register set corresponding to the command to the data processing unit;
 generating a clock alignment training signal, which informs the start of the clock alignment training, by decoding the internal command and an address of the mode register set;
 dividing a frequency of the data clock in half in response to the clock alignment training signal; and
 aligning phases of the data clock of which the frequency is half-divided and a system clock,
 a data transfer between the semiconductor memory device and the data processing unit is aligned after operations of the training decoder and the frequency divider are preformed.

7. The method of claim 6, wherein steps of the inactivating and fixing a data clock and the transferring a command are performed through a data processing unit.

8. The method of claim 7, wherein steps of the outputting an internal command to the aligning phases of the data clock are performed through a semiconductor memory device.

9. The method of claim 7, wherein the dividing the frequency of the data clock in half is reset in response to an activation of the clock alignment training signal.

* * * * *